US011133214B2

(12) United States Patent
Endo (10) Patent No.: US 11,133,214 B2
(45) Date of Patent: Sep. 28, 2021

(54) SUBSTRATE TRANSPORTATION METHOD (71) Applicant: TOKYO ELECTRON LIMITED, Tokyo (JP)

(72) Inventor: Tomoya Endo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 15 days.

(21) Appl. No.: 16/612,715

(22) PCT Filed: May 1, 2018

(86) PCT No.: PCT/JP2018/017373
§ 371 (c)(1),
(2) Date: Nov. 11, 2019

(87) PCT Pub. No.: WO2018/211967
PCT Pub. Date: Nov. 22, 2018

(65) Prior Publication Data
US 2020/0185258 A1 Jun. 11, 2020

(30) Foreign Application Priority Data
May 15, 2017 (JP) .............................. JP2017-096594

(51) Int. Cl.
*H01L 21/687* (2006.01)
*H01L 21/67* (2006.01)
(Continued)

(52) U.S. Cl.
CPC ...... *H01L 21/68742* (2013.01); *H01L 21/677* (2013.01); *H01L 21/67259* (2013.01); *H01L 21/681* (2013.01)

(58) Field of Classification Search
CPC ......... H01L 21/68742; H01L 21/67259; H01L 21/677; H01L 21/681
(Continued)

(56) References Cited

U.S. PATENT DOCUMENTS 9,368,379 B2 * 6/2016 Chen ................. H01L 21/67259
2017/0133253 A1 * 5/2017 Fischer .................. H01L 21/78

FOREIGN PATENT DOCUMENTS

JP 2986141 B2 12/1999
JP 2986142 B2 12/1999
(Continued)

OTHER PUBLICATIONS

PCT International Search Report and Written Opinion, PCT Application No. PCT/JP2018/017373, dated Jun. 12, 2018, 9 pages (with English translation of International Search Report).

*Primary Examiner* — Vu A Vu
(74) *Attorney, Agent, or Firm* — Fenwick & West LLP (57) ABSTRACT

In a substrate transportation method, a first movement process is provided for moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table. Further, a first image capturing process is provided for controlling the camera moved in the first movement process to capture an image of the predetermined region, and a first detection process is provided for detecting a positional displacement and/or a tilting of the substrate lifted by the pins based on the image captured by the camera in the first image capturing process.

10 Claims, 8 Drawing Sheets

(51) Int. Cl.
*H01L 21/677* (2006.01)
*H01L 21/68* (2006.01)

(58) Field of Classification Search
USPC .............................................. 438/5
See application file for complete search history.

(56) References Cited

FOREIGN PATENT DOCUMENTS

| | | |
|---|---|---|
| JP | 3555063 B2 | 8/2004 |
| JP | 2006-186222 A | 7/2006 |
| JP | 2007-324486 A | 12/2007 |
| JP | 2008-241569 A | 10/2008 |
| JP | 2013-235870 A | 11/2013 |
| JP | 2014-175571 A | 9/2014 |
| JP | 2016-213458 A | 12/2016 |

* cited by examiner

SUBSTRATE TRANSPORTATION METHOD

TECHNICAL FIELD

Various aspects and embodiments of the present disclosure relate to a substrate transportation method.

BACKGROUND

In a semiconductor manufacturing process, a plurality of semiconductor devices, each having a predetermined circuit pattern, is formed on a substrate such as a semiconductor wafer or the like. Electrical characteristics of the semiconductor devices formed on the substrate are inspected to sort them into defective products and non-defective products. The inspection of the electrical characteristics of the semiconductor devices is performed by an inspection apparatus in the state of the substrate before the semiconductor devices are divided.

In the inspection apparatus, pins are provided to protrude beyond and retract below a mounting table on which the substrate is mounted. After the inspection of the electrical characteristics of the substrate is completed, the pins protrude beyond the mounting table to lift the substrate. The substrate lifted by the pins is transferred to a transfer arm that has moved to the mounting table. The substrate is unloaded to a predetermined unloading position by the transfer arm.

There have been proposed techniques for aligning the substrate mounted on the mounting table using a camera when the electrical characteristics of the substrate are inspected.

PRIOR ART

Patent Documents 1: Japanese Patent No. 2986141
Patent Documents 1: Japanese Patent No. 2986142
Patent Documents 1: Japanese Patent No. 3555063

However, these techniques are disadvantageous in that it is difficult to prevent damages to the substrate and neighboring components of the substrate during the unloading of the substrate.

In other words, if the substrate mounted on the mounting table is lifted by the pins during the unloading of the substrate, the substrate may be positionally displaced or tilted on the pins. If the transfer arm moves toward the mounting table in a state where the substrate is positionally displaced or tilted, the substrate interferes with its neighboring components such as the transfer arm and the like, which may result in damages to the substrate and the neighboring components of the substrate.

SUMMARY

In accordance with an aspect of the present disclosure, there is provided a substrate transportation method including: a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table; a first image capturing process of controlling the camera moved in the first movement process to capture an image of the predetermined region where the peripheral edge of the substrate is supposed to be located; and a first detection process of detecting a positional displacement and/or a tilting of the substrate lifted by the pins based on the image captured by the camera in the first image capturing process.

Effect of the Invention

According to the aspect of the present disclosure, the substrate transportation method is provided for preventing damages to the substrate and the neighboring components of the substrate during the unloading of the substrate.

DETAILED DESCRIPTION

Hereinafter, embodiments of a substrate transportation method of the present disclosure will be described in detail with reference to the accompanying drawings. Further, like reference numerals will be given to like or corresponding parts throughout the drawings.

Figure 1:
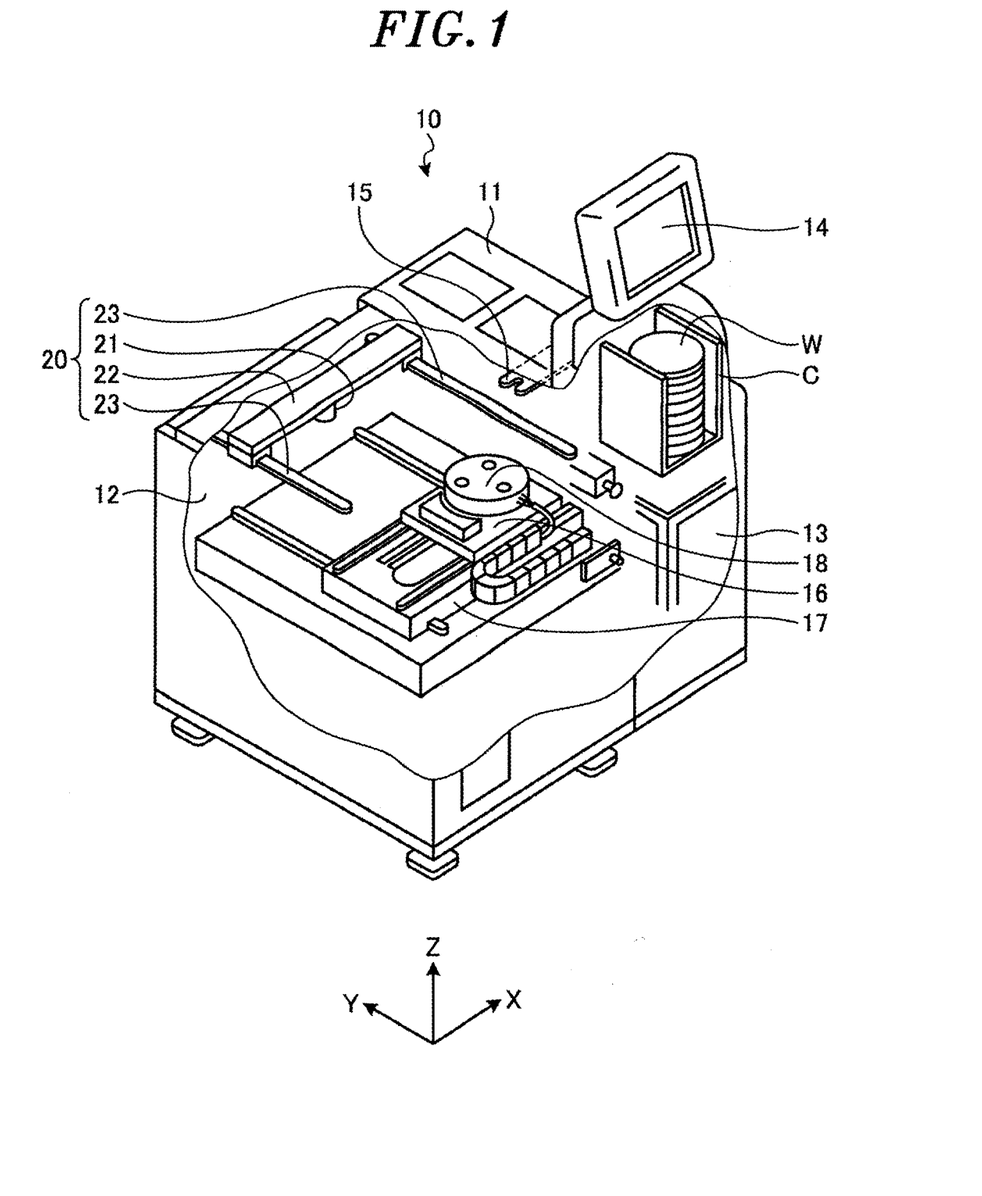
FIG. 1 is a perspective view showing an example of an inspection apparatus according to an embodiment.

FIG. 1 is a perspective view showing an example of an inspection apparatus 10 according to an embodiment. In FIG. 1, a part of the inspection apparatus 10 is cut away for the sake of convenience in description. As shown in FIG. 1, the inspection apparatus 10 includes a loader chamber 11, a prober chamber 12, a control device 13, and a display device 14.

The loader chamber 11 has a transfer arm 15 that is an example of a transfer mechanism. The transfer arm 15 loads a semiconductor wafer (hereinafter, referred to as "wafer") W that is a substrate stored in a cassette C into the prober chamber 12. Further, the transfer arm 15 unloads an inspected wafer W from the prober chamber 12 to a predetermined unloading position.

In the prober chamber 12, the electrical characteristics of the wafer W loaded thereinto by the transfer arm 15 are inspected. An X-stage 16, an Y-stage 17, and the like are provided in the prober chamber 12 to move a mounting table 18 in a vertical direction (the Z-axis direction in FIG. 1) and in a horizontal direction (direction in the XY plane parallel to the X-axis and the Y-axis in FIG. 1). The wafer W is mounted on the mounting table 18 by the transfer arm 15 and attracted and held on the upper surface of the mounting table 18 by a vacuum chuck or the like.

Figure 2:
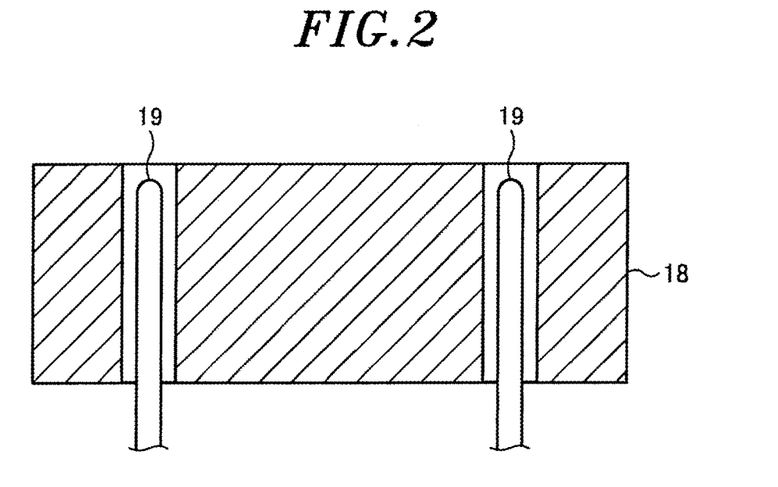
FIG. 2 is a cross-sectional view showing an example of a mounting table according to the embodiment.

FIG. 2 is a cross-sectional view showing an example of the mounting table 18 according to the embodiment. As shown in FIG. 2, the mounting table 18 is provided with pins 19 that are moved up and down by a driving mechanism (not shown) to protrude beyond and retract below the mounting table 18. The pins 19 are provided to temporarily protrude beyond the mounting table 18 to support the wafer W above the mounting table 18 at the time of loading the wafer W to the mounting table 18 or unloading the wafer W from the mounting table 18.

Referring back to FIG. 1, the prober chamber 12 includes an alignment device 20 and a probe card (not shown). The alignment device 20 is an optical bridge alignment device for aligning the wafer W mounted on the mounting table 18 to a predetermined inspection position. The alignment device 20 includes a camera 21, an alignment bridge 22, and a pair of linear guides 23 and 23. The camera 21 is mounted on the alignment bridge 22 with an image capturing direction facing downward. The alignment bridge 22 is supported by the linear guides 23 and 23 to be movable in the Y-axis direction. The alignment bridge 22 is connected to a moving mechanism (not shown), and the moving mechanism moves the alignment bridge 22 in the Y-axis direction. As the alignment bridge 22 moves in the Y-axis direction by using the moving mechanism, the camera 21 mounted on the alignment bridge 22 also moves in the Y-axis direction. The moving mechanism is controlled under the control of the control device 13, and the movement amount of the camera 21 and the movement amount of the alignment bridge 22 are managed by the control device 13.

In order to perform the alignment of the wafer W mounted on the mounting table 18, the alignment bridge 22 is moved in the Y-axis direction from a standby position along the linear guides 23 and 23 by the moving mechanism (not shown). As the alignment bridge 22 moves in the Y-axis direction, the camera 21 mounted on the alignment bridge 22 also moves in the Y-axis direction and reaches a preset alignment position below the probe card. In this state, the wafer W on the mounting table 18 is aligned by the cooperative operation of the camera 21 mounted on the alignment bridge 22 and a camera (not shown) fixed to the mounting table 18 side. After the alignment, the alignment bridge 22 is returned to the original standby position by the moving mechanism (not shown).

The probe card has probe needles for inspecting the electrical characteristics of the wafer W aligned by the alignment device 20. The probe card is fixed in an insert ring at a central opening of a head plate. The heat plate can be opened and closed with respect to an upper surface of the prober chamber 12. A test head (not shown) is rotatably disposed in the prober chamber 12.

In order to inspect the wafer W mounted on the mounting table 18, first, the probe card and a tester (not shown) are electrically connected through the test head. A predetermined signal from the tester is outputted to the wafer W on the mounting table 18 through the probe card, and a response signal from the wafer W is outputted to the tester through the probe card. Accordingly, the electrical characteristics of the wafer W are inspected by the tester. After the inspection of the electrical characteristics of the wafer W is completed, the pins 19 protrude beyond the mounting table 18 to lift the wafer W. The wafer W lifted by the pins 19 is transferred to the transfer arm 15 that has moved to the mounting table 18, and then is unloaded to a predetermined unloading position by the transfer arm 15.

The operation of the inspection apparatus 10 configured as described above is integrally controlled by the control device 13. The control device 13 includes a data processing unit having a program, a memory, and a central processing unit (CPU). The program is set to send control signals from the control device 13 to the respective components of the inspection apparatus 10, execute various steps to be described later in detail, and transfer the wafer W. The memory has, e.g., a write area in which various parameter values are written. When the CPU executes instructions of the program, these processing parameters are read out and control signals corresponding to the parameter values are transmitted to the respective components of the inspection apparatus 10. This program (including programs related to input or display of the processing parameters) is stored in a storage unit such as a computer storage medium, e.g., a flexible disk, a compact disk, a magneto-optical (MO) disk, or the like, and installed in the control device 13.

For example, the control device 13 controls the respective components of the inspection apparatus 10 to perform a substrate transportation method to be described later. Specifically, while the transfer arm 15, which has received an instruction for the unloading of the wafer W mounted on the mounting table 18, is moving to the mounting table 18, the control device 13 controls the camera 21 to move to a position above a predetermined region where the peripheral edge of the wafer W is supposed to be located in a state where the wafer W is lifted by the pins 19 protruding beyond the mounting table 18. Then, the control device 13 controls the moved camera 21 to capture an image of an image capturing region. Then, the control device 13 detects the positional displacement and/or the tilting of the wafer W lifted by the pins 19 based on the image captured by the camera 21.

Figure 3:
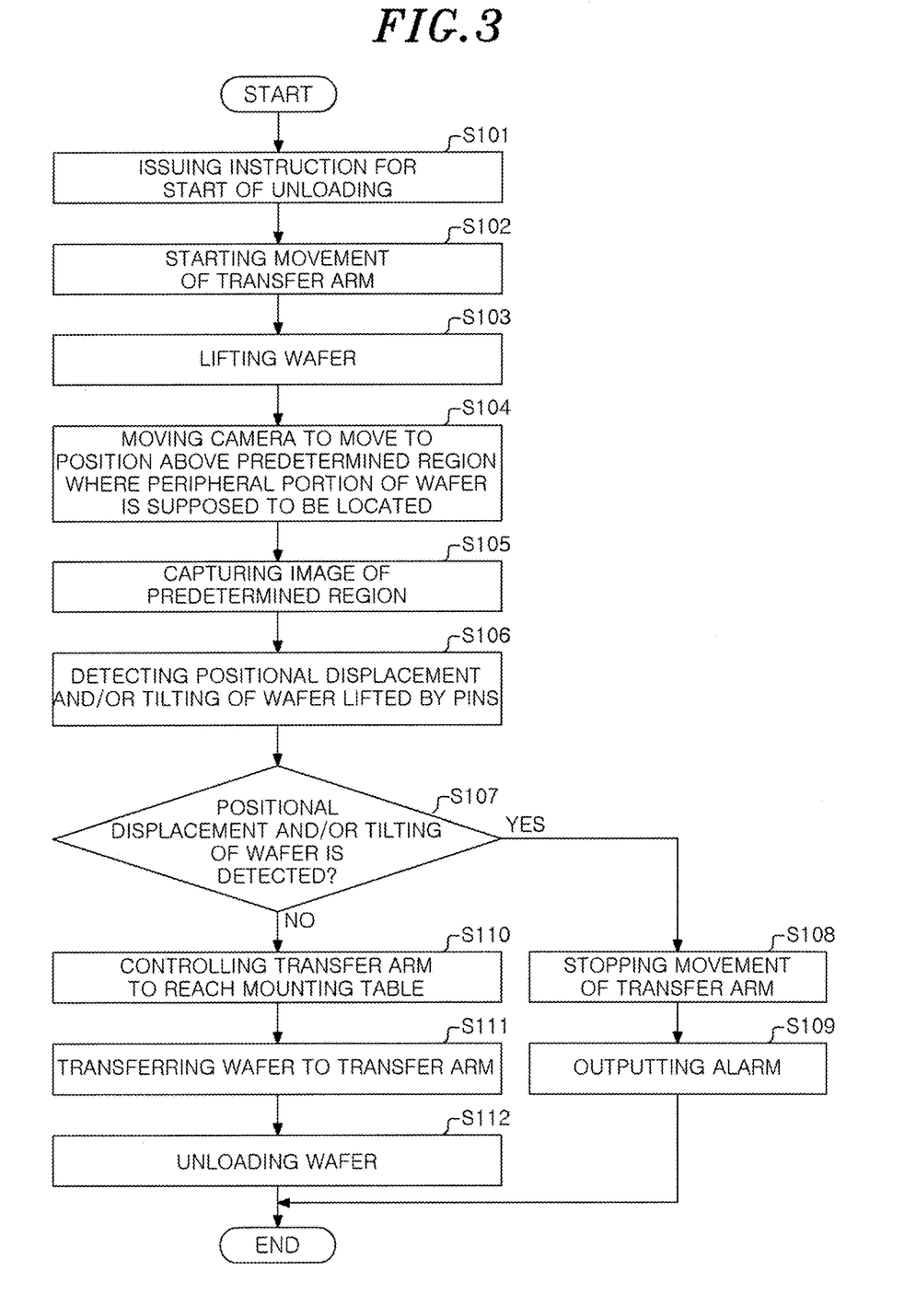
FIG. 3 is a flowchart showing an example of a sequence of a substrate transportation method according to the embodiment.

Next, the substrate transportation method according to an embodiment will be described. FIG. 3 is a flowchart showing an example of a sequence of the substrate transportation method according to the embodiment. For example, the inspection apparatus 10 performs the processes shown in FIG. 3 whenever the inspection of the electrical characteristics of the wafer W is completed. The processes shown in FIG. 3 are performed mainly by the control device 13.

As shown in FIG. 3, when the instruction for starting the unloading of the wafer W mounted on the mounting table 18 is issued to the transfer arm 15 (step S101), the control device 13 controls the transfer arm 15 to move toward the mounting table 18 (step S102). Then, the control device 13 controls the pins 19 to protrude beyond the mounting table 18 and lift the wafer W (step S103).

Next, in a state where the wafer W is lifted by the pins 19, the control device 13 controls the camera 21 to move to the position above the predetermined region where the peripheral edge of the wafer W is supposed to be located (step S104). Step S104 is an example of a first movement process.

Figure 4:
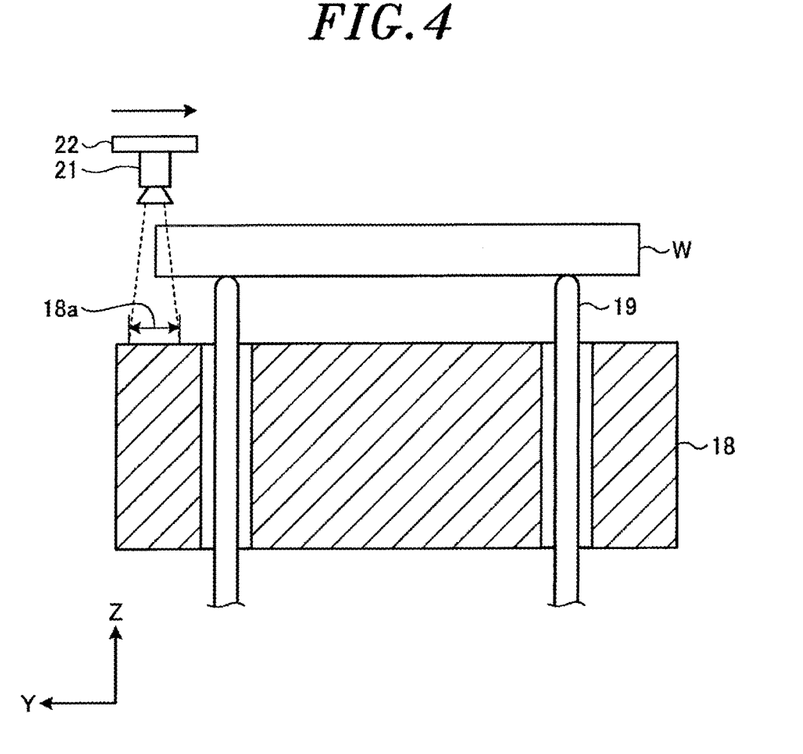
FIG. 4 shows movement of a camera.

FIG. 4 shows the movement of the camera 21. The control device 13 controls the moving mechanism in a state where the wafer W is lifted by the pins 19 so that the alignment bridge 22 and the camera 21 mounted on the alignment bridge 22 can be moved in the Y-axis direction as indicated by an arrow in FIG. 4. In other words, the Y-axis direction is the moving direction of the camera 21. The control device 13 stops the movement of the camera 21 when the camera 21 reaches the position above the predetermined region 18a where the peripheral edge of the wafer W is supposed to be located. Here, the predetermined region 18a indicates a region where the peripheral edge of the wafer W can be located on the upper surface of the mounting table 18 when the wafer W is mounted at a predetermined normal position on the upper surface of the mounting table 18.

Referring back to FIG. 3, the control device 13 controls the moved camera 21 to capture an image of the predetermined region where the peripheral edge of the wafer W is supposed to be located (step S105). The image captured by the camera 21 is, e.g., a rectangular image having an upper side and a lower side parallel to the X-axis, and a left side and a right side parallel to the Y-axis orthogonal to the X-axis. Step S105 is an example of a first image capturing process. When the image capture of the predetermined region is completed, the camera 21 is retracted to the predetermined standby position together with the alignment bridge 22.

Then, the control device 13 detects the positional displacement and/or the tilting of the wafer W lifted by the pins 19 based on the image captured by the camera 21 (step S106). Specifically, the control device 13 detects the positional displacement of the wafer W by determining whether or not the image captured by the camera 21 has a line corresponding to the peripheral edge of the wafer W. Further, the control device 13 detects the tilting of the wafer W by determining whether or not the region corresponding to the wafer W in the image captured by the camera 21 has gradation. Step S106 is an example of a first detection process.

Figure 5:
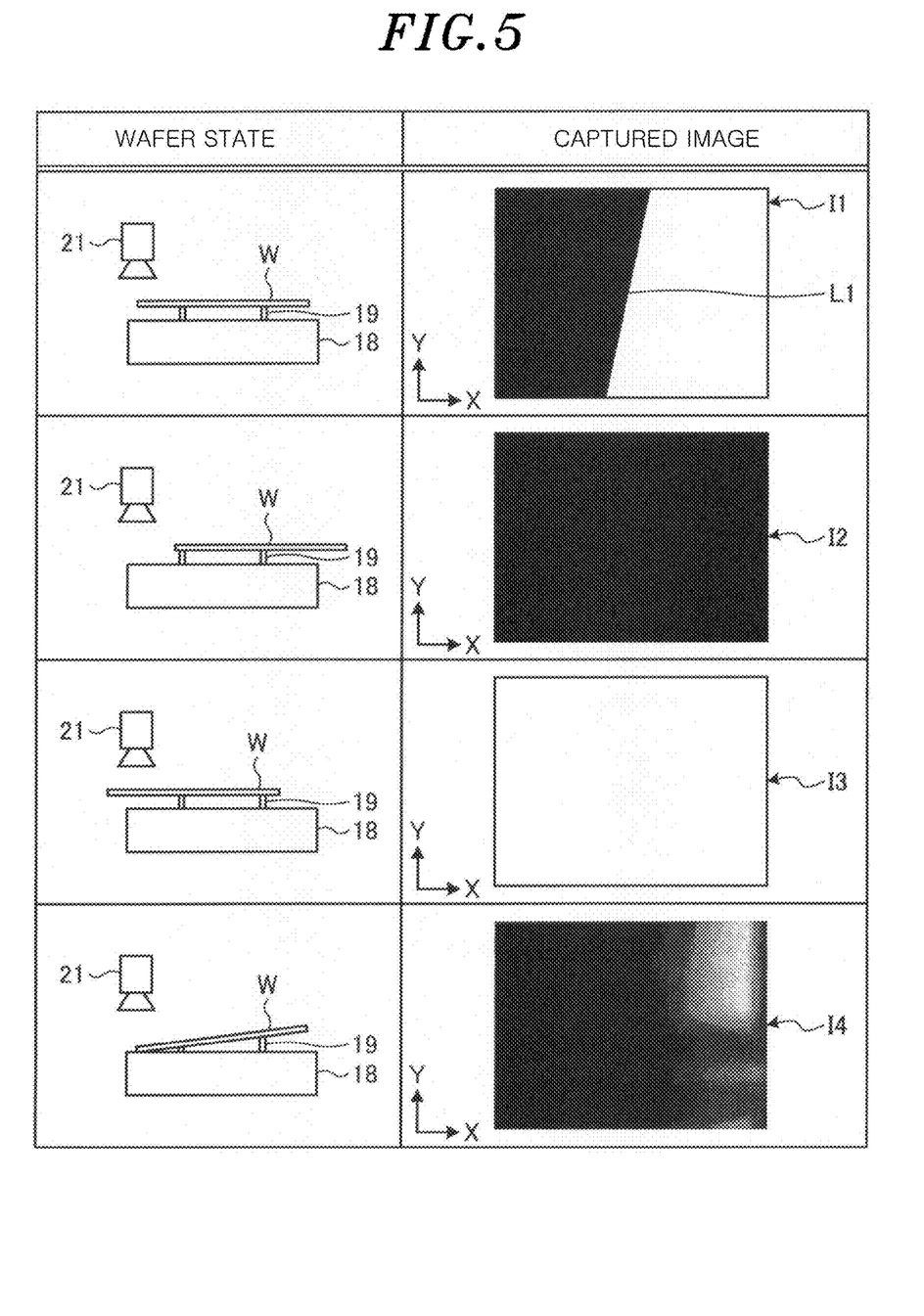
FIG. 5 shows examples of relationship between images captured by the camera and states of a wafer W lifted by pins.

FIG. 5 shows examples of the relationship between the images captured by the camera 21 and the states of the wafer W lifted by the pins 19. In FIG. 5, images I1 to I4 are examples of the images captured by the camera 21. Each of the images I1 to I4 is a rectangular image having an upper side and a lower side parallel to the X-axis, and a left side and a right side parallel to the Y-axis orthogonal to the X-axis.

In the image I1 shown in FIG. 5, a white region indicates a wafer region corresponding to the wafer W, and a black region indicates a no-wafer region other than the region corresponding to the wafer W. Therefore, the image I1 has a line L1 corresponding to the peripheral edge of the wafer W. In this case, it is determined that the wafer W lifted by the pins 19 is located at a normal position (i.e., the position corresponding to the predetermined region 18a in FIG. 4), and the control device 13 detects no positional displacement of the wafer W.

In the image I2 shown in FIG. 5, only the black region indicating the no-wafer region is shown. Therefore, the image I2 has no line corresponding to the peripheral edge of the wafer W. In this case, it is determined that the wafer W lifted by the pins 19 is not located at the normal position (i.e., the position corresponding to the predetermined region 18a in FIG. 4), and the control device 13 detects the positional displacement of the wafer W.

In the image I3 shown in FIG. 5, only the white region indicating the water region is shown. Therefore, the image I3 has no line corresponding to the peripheral edge of the wafer W. In this case, it is determined that the wafer W lifted by the pins 19 is not located at the normal position (i.e., the position corresponding to the predetermined region 18a in FIG. 4), and the control device 13 detects the positional displacement of the wafer W.

In the image I4 shown in FIG. 5, the wafer region corresponding to the wafer W is indicated as a region having gradation. In this case, it is determined that the wafer W lifted by the pins 19 is tilted with respect to the XY plane, and the control device 13 detects the tilting of the wafer W. The region having the gradation is specified using pixel values such as luminance values of respective pixels in the image I4 or the like.

Referring back to FIG. 3, when the positional displacement and/or the tilting of the wafer W is detected (YES in step S107), the control device 13 stops the movement of the transfer arm 15 (step S108) and outputs alarm indicating the occurrence of the positional displacement and/or the tilting of the wafer W to the display device (step S109). Step S108 is an example of a stop process.

On the other hand, when no positional displacement and/or no tilting of the wafer W is detected (NO in step S107), the control device 13 waits until the transfer arm 15 reaches the mounting table 18. When the transfer arm 15 reaches the mounting table 18 (step S110), the control device 13 controls the transfer of the wafer W from the mounting table 18 to the transfer arm 15 (step S111). Then, the wafer W is unloaded to the predetermined unloading position by the transfer arm 15 (step S112).

As described above, according to the present embodiment, the control device 13 controls the camera 21 to move to a position above a predetermined region where the peripheral edge of the wafer W is supposed to be located in a state where the wafer W is lifted by the pins 19 protruding beyond the mounting table 18 while the transfer arm 15 that has received an instruction for starting the unloading of the wafer W mounted on the mounting table 18 is moving to the mounting table 18. Then, the control device 13 controls the moved camera 21 to capture an image of the predetermined region where the peripheral edge of the wafer W is supposed to be located. Next, the control device 13 detects the positional displacement and/or the tilting of the wafer W lifted by the pins 19 based on the image captured by the camera 21.

Therefore, if the wafer W is positionally displaced or tilted on the pins 19 when the unloading of the wafer W is performed, it is possible to quickly stop the movement of the transfer arm 15 and prevent the interference between the wafer W and the neighboring components of the wafer W such as the transfer arm 15 and the like. Consequently, according to the present embodiment, the damages to the wafer W and the neighboring components of the wafer W can be prevented during the unloading of the wafer W.

Further, according to the present embodiment, the camera 21 is installed at the alignment bridge 22 that moves from the standby position to a preset alignment position at the time of performing the alignment of the wafer W mounted on the mounting table 18. Then, the control device 13 controls the alignment bridge 22 and the camera 21 mounted on the alignment bridge 22 to move to the position above the predetermined region in a state where the wafer W is lifted by the pins 19 protruding beyond the mounting table 18. Therefore, in the present embodiment, it is not required to have an additional component for moving the camera 21. Consequently, according to the present embodiment, it is possible to suppress an increase in an equipment cost and prevent the damages to the wafer W and the neighboring components of the wafer W during the unloading of the wafer W.

Other Embodiments

The present disclosure is not limited to the above-described embodiment, and various modifications can be made within the scope of the gist of the present disclosure.

For example, the above embodiment has described an example in which the positional displacement of the wafer W is detected by determining whether or not the image captured by the camera 21 has the line corresponding to the peripheral edge of the wafer W. However, the method for detecting the positional displacement of the wafer W is not limited thereto. Hereinafter, a first to a third modification of the method for detecting the positional displacement of the wafer W will be described.

Figure 6:
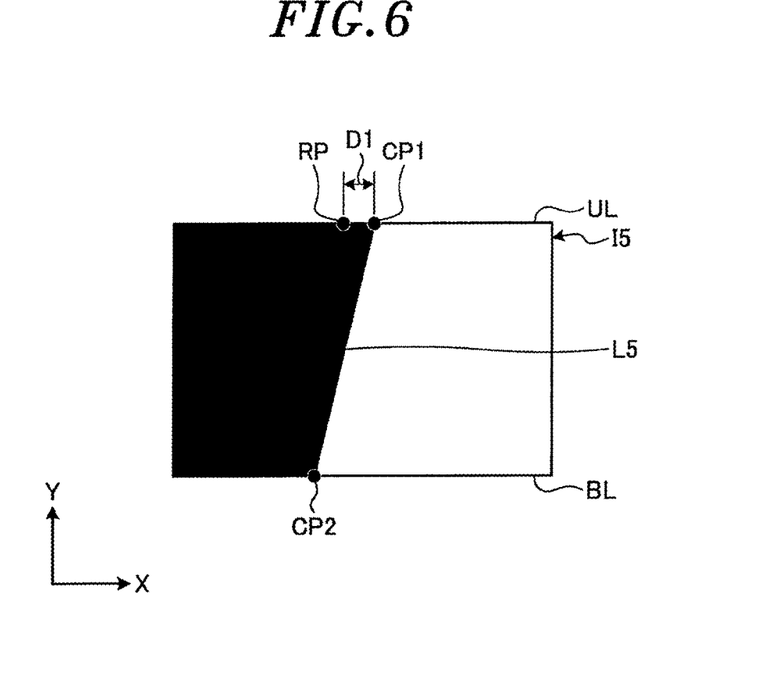
FIG. 6 shows a first modification of a detection method of a positional displacement of a wafer.

FIG. 6 shows the first modification of the method for detecting the positional displacement of the wafer W. In FIG. 6, an image I5 is an example of the image captured by the camera 21. The image I5 is a rectangular image having an upper side and a lower side parallel to the X-axis, and a left side and a right side parallel to the Y-axis orthogonal to the X-axis. For example, as shown in FIG. 6, the inspection apparatus 10 specifies a position of an intersection point CP1 between a line UL corresponding to the upper side of the image I5 captured by the camera 21 and a line L5 corresponding to the peripheral edge of the wafer W in the image I5. Then, the inspection apparatus 10 detects the positional displacement of the wafer W in the X-axis based on a distance D1 between the specified intersection point CP1 and a reference point RP that is preset on the upper side. In other words, the inspection apparatus 10 detects the positional displacement of the wafer W in the X-axis when the distance D1 between the intersection point CP1 and the reference point RP is equal to or greater than a predetermined threshold.

In the first modification shown in FIG. 6, the position of the intersection point CP1 between the line UL corresponding to the upper side of the image I5 and the line L5 corresponding to the peripheral edge of the wafer W is specified, and the positional displacement of the wafer W in the X-axis is detected based on the distance D1 between the intersection point CP1 and the reference point RP. However, the present disclosure is not limited thereto. For example, the inspection apparatus 10 may specify a position of an intersection point CP2 between a line BL corresponding to the lower side of the image I5 and the line L5 corresponding to the peripheral edge of the wafer W and detect the positional displacement of the wafer W in the X-axis based on a distance between the intersection point CP2 and the reference point (not shown) that is preset on the lower side.

Figure 7:
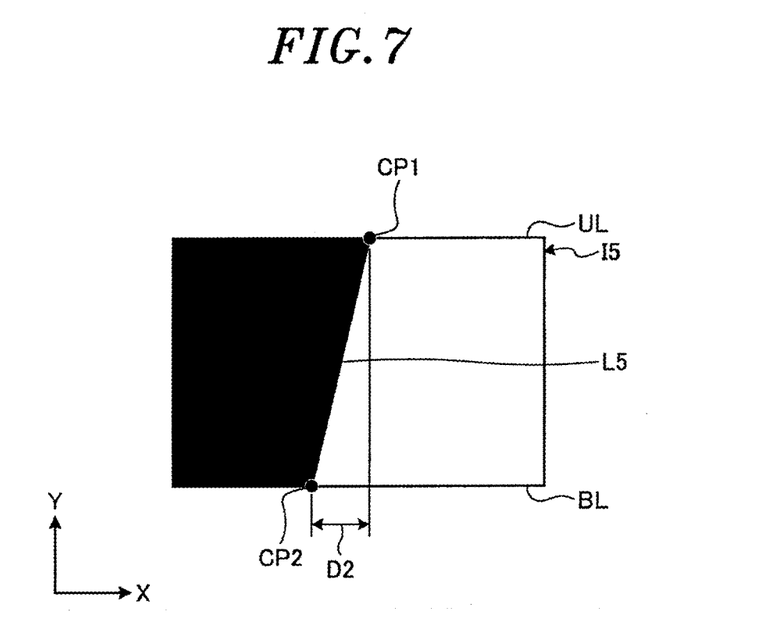
FIG. 7 shows a second modification of the detection method of the positional displacement of the wafer.

FIG. 7 shows the second modification of the method for detecting the positional displacement of the wafer W. In FIG. 7, the image I5 is an example of the image captured by the camera 21. The image I5 is a rectangular image having an upper side and a lower side parallel to the X-axis and a left side and a right side parallel to the Y-axis orthogonal to the X-axis. For example, as shown in FIG. 7, the inspection apparatus 10 specifies a first intersection point CP1 between a line UL corresponding to the upper side of the image I5 captured by the camera 21 and a line L5 corresponding to the peripheral edge of the wafer W in the image I5. Then, the inspection apparatus 10 specifies a second intersection point CP2 between a line BL corresponding to the lower side of the image I5 and the line L5 corresponding to the peripheral edge of the wafer W in the image I5. Next, the inspection apparatus 10 detects the positional displacement of the wafer W in the Y-axis based on the distance D2 between the first intersection point CP1 and the second intersection point CP2 in the X-axis. In other words, the inspection apparatus 10 detects the displacement of the wafer W in the Y-axis when the distance D2 between the first intersection point CP1 and the second intersection point CP2 in the X-axis is equal to or greater than a predetermined threshold.

Figure 8:
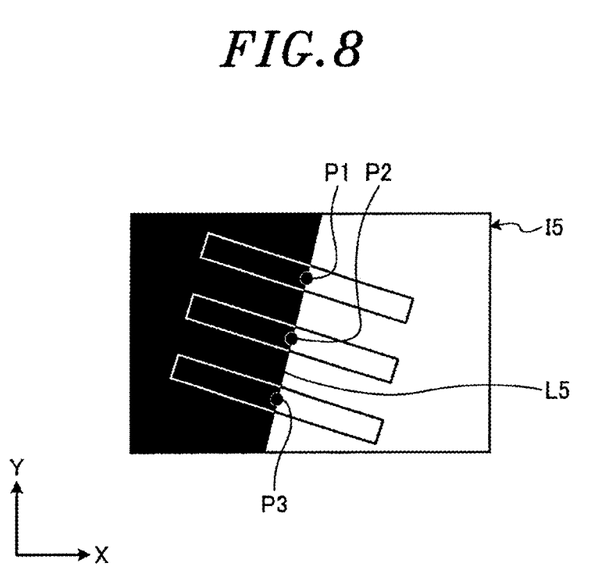
FIG. 8 shows a third modification of the detection method of the positional displacement of the wafer.

FIG. 8 shows the third modification of the method for detecting the positional displacement of the wafer W. In FIG. 8, the image I5 is an example of the image captured by the camera 21. The image I5 is a rectangular image having an upper side and a lower side parallel to the X-axis and a left side and a right side parallel to the Y-axis orthogonal to the X-axis. For example, as shown in FIG. 8, the inspection apparatus 10 calculates the central position of the wafer W using a line L5 corresponding to the peripheral edge of the wafer W in the image I5 captured by the camera 21 and detects the positional displacement of the wafer W based on the amount of displacement between the central position of the wafer W and a predetermined reference position. In other words, the inspection apparatus 10 detects the positional displacement of the wafer W when the amount of displacement between the calculated central position of the wafer W and the predetermined reference position is equal to or greater than a predetermined threshold.

Here, the method for calculating the central position of the wafer W using the line L5 will be described in detail. First, coordinates of three points (points P1 to P3) on the line L5 are detected. Then, the coordinates of the central position of the wafer W are calculated from the detected coordinates of the three points (points P1 to P3) using a known calculation method (e.g., Newton-Raphson method).

Alternatively, the coordinates of the central position of the wafer W may be calculated based on coordinates of any three points on the line L5. Since, however, the wafer W is not a perfect circle microscopically, the method of calculating the coordinates of the central position of the wafer W based on the coordinates of any three points has a problem in that an error in the calculated coordinates of the central position of the wafer W may increase.

Therefore, in the third modification, as shown in FIG. 8, three rectangular frames are set with respect to the line L5 corresponding to the peripheral edge of the wafer W in the image I5, and pixel positions of the line L5 in each of the rectangular frames are averaged to obtain the coordinates of each of three points (points P1 to P3). Then, in the third modification, the coordinates of the central position of the wafer W are calculated from the detected coordinates of the three points (points P1 to P3). Accordingly, it is possible to reduce the error in the calculated coordinates of the central position of the wafer W, and further to improve the detection accuracy of the positional displacement of the wafer W.

Further, the above embodiment has described an example in which the tilting of the wafer W is detected by determining whether or not the region corresponding to the wafer W in the image captured by the camera 21 is a region having gradation. However, the method for detecting the tilting of the wafer W is not limited thereto. For example, the inspection apparatus 10 may detect the tilting of the wafer W by determining whether or not the line corresponding to the peripheral edge of the wafer W in the image captured by the camera 21 includes a curve that is curved in a direction opposite to a curved direction of the actual peripheral edge of the wafer W. The curve that is curved in a direction opposite to the curved direction of the actual peripheral edge of the wafer W includes a zigzag curve.

Further, the above embodiment has described an example in which the positional displacement and/or the tilting of the wafer W is detected while the transfer arm 15 that has received an instruction for starting the unloading of the wafer W mounted on the mounting table 18 is moving to the mounting table 18. However, the present disclosure is not limited thereto. For example, the positional displacement and/or the tilting of the wafer W may be detected again after the transfer arm 15 reaches the mounting table 18 and the wafer W lifted by the pins 19 is transferred to the transfer arm 15. In the following description, a substrate transportation method in which the positional displacement and/or the tilting of the wafer W is detected after the transfer arm 15 reaches the mounting table 18 and the wafer W lifted by the pins 19 is transferred to the transfer arm 15 will be described with reference to FIG. 9.

Figure 9:
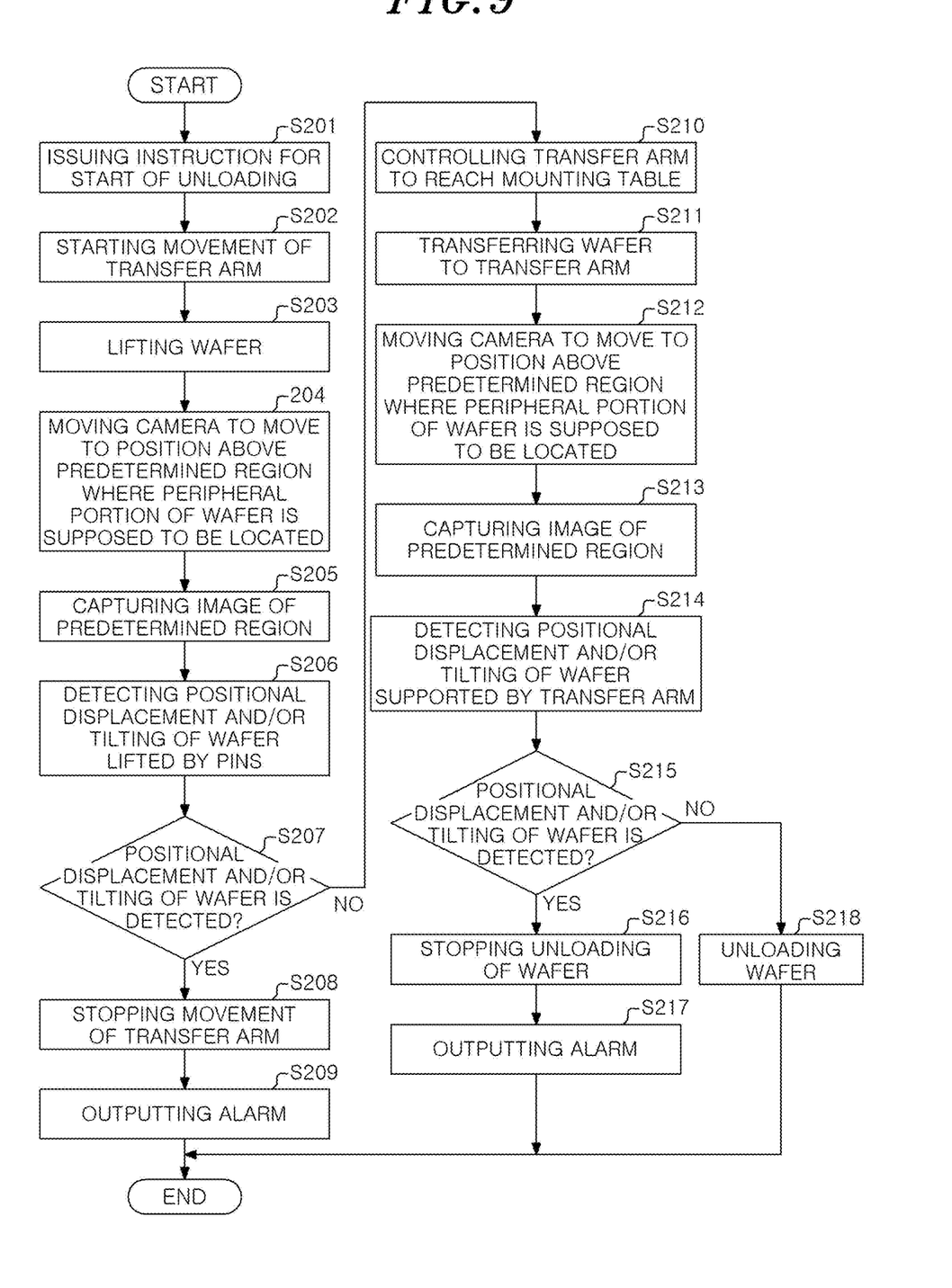
FIG. 9 is a flowchart showing another example of the sequence of the substrate transportation method.

FIG. 9 is a flowchart showing another example of the sequence of the substrate transportation method. For example, the inspection apparatus 10 performs the processes shown in FIG. 9 whenever the inspection of the electrical characteristics of the wafer W is completed. The processes shown in FIG. 9 are performed mainly by the control device 13.

As shown in FIG. 9, when the instruction for starting the unloading of the wafer W mounted on the mounting table 18 is issued to the transfer arm 15 (step S201), the control device 13 controls the transfer arm 15 to move toward the mounting table 18 (step S202). Then, the control device 13 controls the pins 19 to protrude beyond the mounting table 18 and lift the wafer W (step S203).

Next, in a state where the wafer W is lifted by the pins 19, the control device 13 controls the camera 21 to move to the position above the predetermined region where the peripheral edge of the wafer W is supposed to be located (step S204). Step S204 is an example of the first movement process. Since the details of step S204 are the same as those of step S104, description thereof will be omitted.

Then, the control device 13 controls the moved camera 21 to capture an image of the predetermined region where the peripheral edge of the wafer W is supposed to be located (step S205). The image captured by the camera 21 is, e.g., a rectangular image having an upper side and a lower side parallel to the X-axis, and a left side and a right side parallel to the Y-axis orthogonal to the X-axis. Step S205 is an example of the first image capturing process. When the image capture of the predetermined region is completed, the camera 21 is retracted to the predetermined standby position together with the alignment bridge 22.

Next, the control device 13 detects the positional displacement and/or the tilting of the wafer W lifted by the pins 19 based on the image captured by the camera 21 (step S206). Step S206 is an example of the first detection process. Since the details of step S206 are the same as those of Step S106, description thereof will be omitted.

When the positional displacement and/or the tilting of the wafer W is detected (YES in step S207), the control device 13 stops the movement of the transfer arm 15 (step S208) and outputs alarm indicating the occurrence of the positional displacement and/or the tilting of the wafer W to the display device 14 (step S209). Step S208 is an example of the stop process.

On the other hand, when no positional displacement and/or no tilting of the wafer W is detected (NO in step S207), the control device 13 waits until the transfer arm 15 reaches the mounting table 18. When the transfer arm 15 reaches the mounting table 18 (step S210), the control device 13 controls the transfer of the wafer W from the mounting table 18 to the transfer arm 15 (step S211).

When the wafer W lifted up by the pins 19 is transferred to the transfer arm 15, the control device 13 controls the camera 21 to move to a position above a predetermined region where the peripheral edge of the wafer W is supposed to be located in a state where the wafer W is supported by the transfer arm 15 (step S212). Step S212 is an example of a second movement process.

Next, the control device 13 controls the moved camera 21 to capture an image of the predetermined region where the peripheral edge of the wafer W supported by the transfer arm 15 is supposed to be located (step S213). The image captured by the camera 21 is, e.g., a rectangular image having an upper side and a lower side parallel to the X-axis and a left side and a right side parallel to the Y-axis orthogonal to the X-axis. Step S213 is an example of a second image capturing process. When the image capture of the predetermined region is completed, the camera 21 is retracted to the predetermined standby position together with the alignment bridge 22.

Then, the control device 13 detects the positional displacement and/or the tilting of the wafer W supported by the transfer arm 15 based on the image captured by the camera 21 (step S214). Step S214 is an example of a second detection process. Since the details of step S214 are the same as those of Step S106, description thereof will be omitted.

When the positional displacement and/or the tilting of the wafer W is detected (YES in step S215), the control device 13 stops the unloading of the wafer W performed by the transfer arm 15 (step S216) and outputs alarm indicating the occurrence of the positional displacement and/or the tilting of the wafer W to the display device 14 (step S217).

On the other hand, when no positional displacement and/or no tilting of the wafer W is detected (NO in step S215), the wafer W is unloaded to the predetermined unloading position by the transfer arm 15 (step S218).

By detecting the positional displacement and/or the tilting of the wafer W after the wafer W lifted by the pins 19 is transferred to the transfer arm 15, it is possible to more reliably prevent damages to the wafer W and the neighboring components of the wafer W during the unloading of the wafer W.

DESCRIPTION OF REFERENCE NUMERALS

10: inspection apparatus
11: loader chamber
12: prober chamber
13: control device
14: display device
15: transfer arm
16: X-stage
17: Y-stage
18: mounting table
18a: predetermined region
19: pins
20: alignment device
21: camera
22: alignment bridge
23: linear guide

What is claimed is:

1. A substrate transportation method comprising:
a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table;
a first image capturing process of controlling the camera moved in the first movement process to capture an image of the predetermined region where the peripheral edge of the substrate is supposed to be located; and
a first detection process of detecting a positional displacement and/or a tilting of the substrate lifted by the pins based on the image captured by the camera in the first image capturing process,
wherein the image captured by the camera in the first image capturing process is a rectangular image having an upper side and a lower side parallel to a first axis and a left side and a right side parallel to a second axis perpendicular to the first axis, and in the first detection process, a position of an intersection point between a line corresponding to the upper side or the lower side of the image captured by the camera in the first image capturing process and a line corresponding to the peripheral edge of the substrate in the image is specified, and the positional displacement of the substrate in the first axis is detected based on a distance between the specified position of the intersection point and a position of a reference point that is preset on the upper side or the lower side.

2. The substrate transportation method of claim 1, further comprising: a stop process of stopping the movement of the transfer mechanism when the positional displacement and/or the tilting of the substrate is detected in the first detection process.

3. A substrate transportation method comprising:

a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table;

a first image capturing process of controlling the camera moved in the first movement process to capture an image of the predetermined region where the peripheral edge of the substrate is supposed to be located; and a first detection process of detecting a positional displacement and/or a tilting of the substrate lifted by the pins based on the image captured by the camera in the first image capturing process, wherein the image captured by the camera in the first image capturing process is a rectangular image having an upper side and a lower side parallel to a first axis and a left side and a right side parallel to a second axis perpendicular to the first axis, and in the first detection process, a position of a first intersection point between a line corresponding to the upper side of the image captured by the camera in the first image capturing process and a line corresponding to the peripheral edge of the substrate in the image is specified; a position of a second intersection point between a line corresponding to the lower side of the image and the line corresponding to the peripheral edge of the substrate in the image is specified; and the positional displacement of the substrate in the second axis is detected based on a distance between the first intersection point and the second intersection point in the first axis.

4. The substrate transportation method of claim 3, further comprising:

a stop process of stopping the movement of the transfer mechanism when the positional displacement and/or the tilting of the substrate is detected in the first detection process.

5. A substrate transportation method comprising:

a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table;

a first image capturing process of controlling the camera moved in the first movement process to capture an image of the predetermined region where the peripheral edge of the substrate is supposed to be located; and a first detection process of detecting a positional displacement and/or a tilting of the substrate lifted by the pins based on the image captured by the camera in the first image capturing process, wherein in the first detection process, the tilting of the substrate is detected by determining whether or not a region corresponding to the substrate in the image captured by the camera in the first image capturing process is a region having gradation.

6. The substrate transportation method of claim 5, further comprising:

a stop process of stopping the movement of the transfer mechanism when the positional displacement and/or the tilting of the substrate is detected in the first detection process.

7. A substrate transportation method comprising:

a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table;

a first image capturing process of controlling the camera moved in the first movement process to capture an image of the predetermined region where the peripheral edge of the substrate is supposed to be located; and a first detection process of detecting a positional displacement and/or a tilting of the substrate lifted by the pins based on the image captured by the camera in the first image capturing process, wherein in the first detection process, the tilting of the substrate is detected by determining whether or not a line corresponding to the peripheral edge of the substrate in the image captured by the camera in the first image capturing process includes a curve that is curved in a direction opposite to a curved direction of an actual peripheral edge of the substrate.

8. The substrate transportation method of claim 7, further comprising:

a stop process of stopping the movement of the transfer mechanism when the positional displacement and/or the tilting of the substrate is detected in the first detection process.

9. A substrate transportation method comprising:

a first movement process of moving a camera to a position above a predetermined region where a peripheral edge of a substrate is supposed to be located in a state where the substrate is lifted by pins protruding beyond a mounting table while a transfer mechanism that has received an instruction for starting an unloading of the substrate mounted on the mounting table is moving to the mounting table;

a first image capturing process of controlling the camera moved in the first movement process to capture an image of the predetermined region where the peripheral edge of the substrate is supposed to be located; and a first detection process of detecting a positional displacement and/or a tilting of the substrate lifted by the pins based on the image captured by the camera in the first image capturing process, wherein in the first detection process, a central position of the substrate is calculated using a line corresponding to the peripheral edge of the substrate in the image captured by the camera in the first image capturing process, and the positional displacement of the substrate is detected based on an amount of displacement between the calculated central position of the substrate and a predetermined reference position.

10. The substrate transportation method of claim 9, further comprising:
a stop process of stopping the movement of the transfer mechanism when the positional displacement and/or the tilting of the substrate is detected in the first detection process.

* * * * *